(12) United States Patent
Kanai et al.

(10) Patent No.: US 11,719,758 B2
(45) Date of Patent: Aug. 8, 2023

(54) LOAD ABNORMALITY DETECTING CIRCUIT FOR INVERTER

(71) Applicant: NETUREN CO., LTD., Tokyo (JP)

(72) Inventors: Takahiko Kanai, Tokyo (JP); Yue Yang, Tokyo (JP)

(73) Assignee: NETUREN CO., LTD., Tokyo (JP)

( * ) Notice: Subject to any disclaimer, the term of this patent is extended or adjusted under 35 U.S.C. 154(b) by 419 days.

(21) Appl. No.: 16/758,147

(22) PCT Filed: Aug. 23, 2018

(86) PCT No.: PCT/JP2018/031233
§ 371 (c)(1),
(2) Date: Apr. 22, 2020

(87) PCT Pub. No.: WO2019/087542
PCT Pub. Date: May 9, 2019

(65) Prior Publication Data
US 2020/0284847 A1    Sep. 10, 2020

(30) Foreign Application Priority Data
Nov. 1, 2017  (JP) .................................. 2017-212183

(51) Int. Cl.
*G01R 31/42* (2006.01)
*H02M 1/32* (2007.01)
*H02M 5/458* (2006.01)

(52) U.S. Cl.
CPC .............. *G01R 31/42* (2013.01); *H02M 1/32* (2013.01); *H02M 5/458* (2013.01)

(58) Field of Classification Search
CPC .......... G01R 31/42; H02M 1/32; H02M 5/458
See application file for complete search history.

(56) References Cited

U.S. PATENT DOCUMENTS 6,226,196 B1    5/2001    Toshinari et al.

FOREIGN PATENT DOCUMENTS

| JP | 6-284736 | 10/1994 |
| JP | 11-235044 | 8/1999 |
| JP | 11-329707 | 11/1999 |
| JP | 3652098 | 5/2005 |

(Continued)

OTHER PUBLICATIONS

International Search Report and Written Opinion of the International Searching Authority, dated Nov. 21, 2018 in corresponding International Patent Application No. PCT/JP2018/031233.

*Primary Examiner* — Minh Q Phan
(74) *Attorney, Agent, or Firm* — Wenderoth, Lind & Ponack, L.L.P.

(57) ABSTRACT

A load abnormality detecting circuit for an inverter to detect abnormality of a load during an operation of the inverter which has a self-arc-extinguishing element as a switching element and a phase synchronizing loop controlling an output frequency to be a resonance frequency of the load, the load abnormality detecting circuit includes a phase shift detection part that detects a phase shift between a gate voltage signal controlling ON/OFF of the self-arc-extinguishing element and an output current of the inverter which is applied to the load, and that sends a first abnormal load signal based on the phase shift.

9 Claims, 5 Drawing Sheets

(56) References Cited

FOREIGN PATENT DOCUMENTS

| | | | |
|---|---|---|---|
| JP | 3652098 B2 | * | 5/2005 |
| JP | 2005-166621 | | 6/2005 |
| JP | 2005166621 A | * | 6/2005 |
| JP | 2007-159174 | | 6/2007 |
| JP | 2007-280897 | | 10/2007 |
| JP | 2015-119583 | | 6/2015 |

* cited by examiner

LOAD ABNORMALITY DETECTING CIRCUIT FOR INVERTER

TECHNICAL FIELD

The present invention relates to a load abnormality detecting circuit for an inverter which is provided in order to protect the inverter from an influence due to abnormality of a load supplied with power from the inverter when the abnormality occurs in the load.

BACKGROUND

In the related art, an inverter apparatus is used as a power supply device that supplies AC power to a load. When power is supplied to the inverter apparatus, since its frequency can be arbitrarily set as well as a voltage value and a current value applied to the load, the power is supplied in accordance with the characteristics of the load and an amount of work to be required, so that there is no wastefulness in the supply of the power to the load and thus the supply of the power can be efficiently performed.

Figure 5:
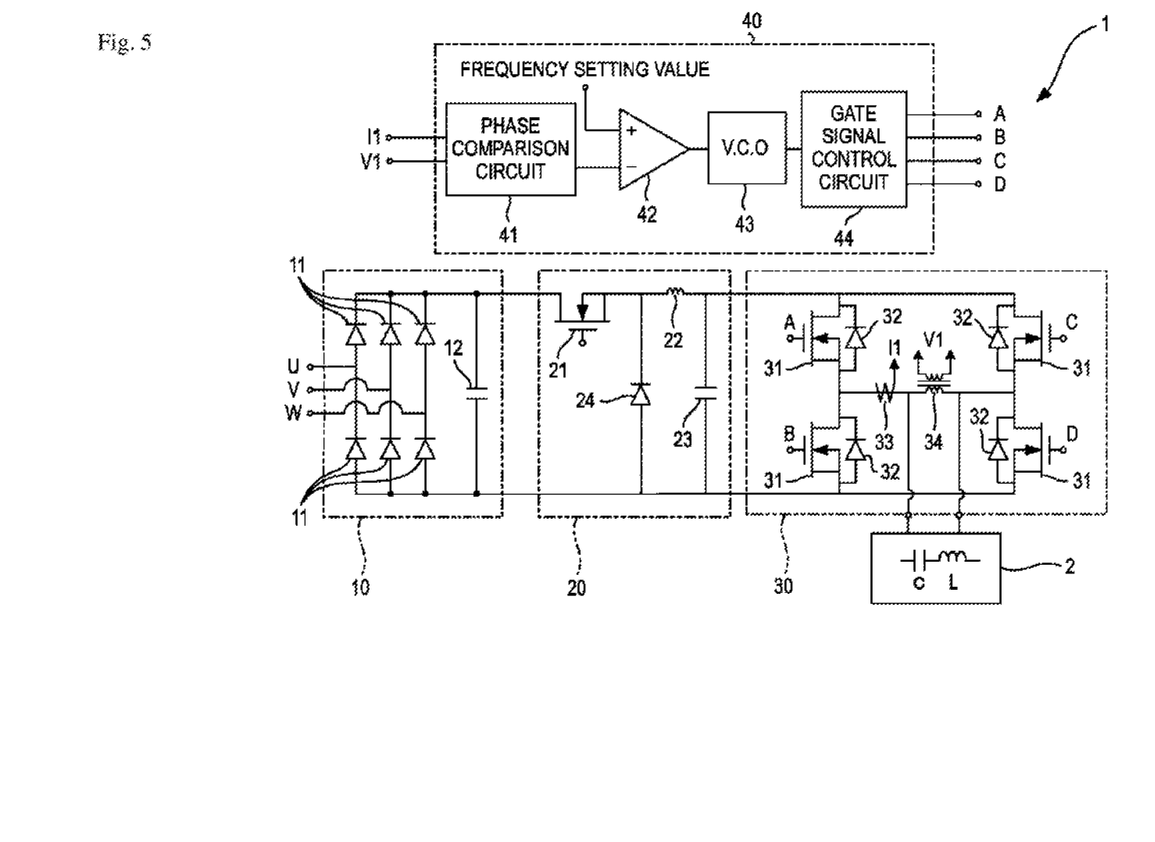
FIG. 5 is a circuit diagram illustrating the related art.

As an example of the inverter apparatus, as illustrated in FIG. 5, there is known an inverter apparatus 1 including a rectifier circuit 10 that converts three-phase AC power to DC power by a diode 11 and a smoothing capacitor 12, a constant voltage circuit 20 that shapes an output voltage of the rectifier circuit 10 to a predetermined voltage, an inverter circuit 30 that converts a DC voltage from the constant voltage circuit 20 to AC power, and a phase synchronizing loop circuit (hereinafter, abbreviated as a "PLL circuit") 40 that controls a frequency of the AC power output from the inverter circuit 30 to be a resonance frequency of a load 2. The inverter apparatus 1 is a voltage type inverter apparatus that generates the AC power having a high frequency regardable as a high frequency and has small output impedance.

The constant voltage circuit 20 is a chopper type constant voltage circuit that stably supplies a predetermined DC voltage to an output side even though there are variations in a load or an input voltage. The constant voltage circuit 20 is provided with a MOSFET 21 for power control, which is a fast switching element serving as a chopper body, a reactor 22 and a capacitor 23 for voltage and current smoothing, and a free-wheeling diode 24 serving as a load current path when the MOSFET 21 is turned off. The constant voltage circuit 20 can adjust an output voltage by changing a width of an ON time of a periodic signal applied to a gate of the MOSFET 21.

The inverter circuit 30 is provided with MOSFETs 31 for frequency control, which are fast switching elements connected in a bridge shape. A diode 32 is connected in parallel to each of the MOSFETs 31 to return a lagging current component to a DC circuit in the case of an inductive load or to reflux the lagging current component in a bridge. Furthermore, the inverter circuit 30 is provided with a current transformer 33 and a transformer 34 which are connected to the load 2 including an inductor L and a capacitor C in order to detect a current I1 and a voltage V1 to the load 2.

The PLL circuit 40 is provided with a phase comparison circuit 41 that detects a phase shift of the current I1 and the voltage V1 to the load 2, an analog adder/subtractor 42 that adds/subtracts a preset frequency setting value in order to match the phase shift of the current I1 and the voltage V1 detected by the phase comparison circuit 41, a voltage controlled oscillator 43 that outputs a signal having a frequency corresponding to a voltage output from the analog adder/subtractor 42, and a gate signal control circuit 44 that sequentially sends signals to gates A to D of the MOSFETs 31 of the inverter circuit 30 in accordance with the frequency of the signal output from the voltage controlled oscillator 43.

According to such an inverter apparatus 1, the AC power having a high frequency re-gardable as a high frequency can be generated, so that it can be used in high frequency hardening of a steel material and the like. In addition, since the output frequency is controlled to match the phase shift of the current I1 and the voltage V1 to the load 2, the output power frequency coincides with the resonance frequency of the load 2 including the inductor L and the capacitor C, so that it is possible to efficiently operate the load 2.

During the operation of the inverter apparatus 1, when there occurs abnormality such as short-circuit and opening of a part of the load 2-side circuit, since the impedance of the load 2 is rapidly changed, the resonance frequency is greatly varied. Then, since the PLL circuit 40 of the inverter apparatus 1 controls the output frequency to operate at the resonance frequency of the load 2, a large current or voltage may be instantaneously generated in a transient state and thus the MOSFETs 31 may be broken. Particularly, when the phase of the current I1 is advanced with respect to the phase of the voltage V1 due to the change in the impedance of the load 2, a relatively large surge voltage is generated, resulting in a problem that the MOSFETs 31 is easily broken by the surge voltage.

A load abnormality detecting circuit for an inverter of the related art is added to the aforementioned inverter apparatus 1, detects the phase shift of the output voltage V1 and the output current I1 output from the inverter apparatus 1 to the load 2, and sends an abnormal load signal based on the phase shift (see, for example, the PTL 1: JP3652098). The load abnormality detecting circuit receives the current I1 and the voltage V1 respectively obtained from the current transformer 33 and the transformer 34 connected to the PLL circuit 40. Then, the load abnormality detecting circuit shapes the input current I1 and voltage V1 to predetermined square waves, inverts a waveform of one (for example, the current I1) of them, and compares the inverted waveform of the current I1 with a waveform of the voltage V1.

When abnormality occurs in the load 2 and the resonance frequency of the load 2 is shifted from an operating frequency of the inverter apparatus 1, since the resonance circuit of the load 2 serves as a capacitive load, the phase of the current I1 is advanced with respect to the phase of the voltage V1. In this case, the load abnormality detecting circuit turns off all gate signals of the MOSFETs 31 of the inverter circuit 30 and also turns off the MOSFET 21 used in the chopper type constant voltage circuit 20, thereby preventing inflow of a current from an input side. In this way, the supply of power to the load 2 is stopped and the MOSFETs 31 are protected.

PTL 1: JP3652098

As the MOSFET 31 of the inverter circuit 30, a Si-MOSFET is generally used;

however, in recent years, a SiC-MOSFET is used because a rated current per one element is large and a switching speed is fast as compared with the MOSFET made of Si. However, in the SiC-MOSFET, ringing easily occurs at the lime of OFF in a high speed operation, as compared with the Si-MOSFET. In the load abnormality detecting circuit of the related art, when the ringing occurs in the MOSFET 31, since high frequency noise is superposed on the waveform of the voltage V1 input to the load abnormality detecting circuit, an erroneous operation may occur due to an increase in the noise component.

The load abnormality detecting circuit of the related art is provided with a waveform shaper that shapes the input voltage V1 to a square wave, wherein the waveform shaper includes a resistor, a capacitor for cutting an unnecessary harmonic component included in the waveform of the voltage V1, and the like. When the capacity of the capacitor is increased, the noise component included in the waveform of the voltage V1 can be removed; however, when the capacity of the capacitor is excessively increased, since a time constant of a filter including the resistor and the capacitor becomes large, delay may occur in the phase of the shaped square wave with respect to the phase of the waveform of the input voltage V1. The load abnormality detecting circuit detects load abnormality based on the phase shift of the voltage V1 and the current I1, but erroneous detection may occur due to the delay of the phase of the square wave generated from the voltage V1.

SUMMARY

One or more embodiments provide a load abnormality detecting circuit for the inverter, being capable of accurately and quickly detecting abnormality of a load and preventing breakage of a switching element which is an important element of the inverter.

In an aspect (1), a load abnormality detecting circuit for an inverter to detect abnormality of a load during an operation of the inverter which has a self-arc-extinguishing element as a switching element and a phase synchronizing loop controlling an output frequency to be a resonance frequency of the load, the load abnormality detecting circuit includes a phase shift detection part that detects a phase shift between a gate voltage signal controlling ON/OFF of the self-arc-extinguishing element and an output current of the inverter which is applied to the load, and that sends a first abnormal load signal based on the phase shift.

The load abnormality detecting circuit for the inverter is capable of accurately and quickly detecting abnormality of a load and preventing breakage of a switching element which is an important element of the inverter.

DESCRIPTION OF EMBODIMENTS

Figure 1:
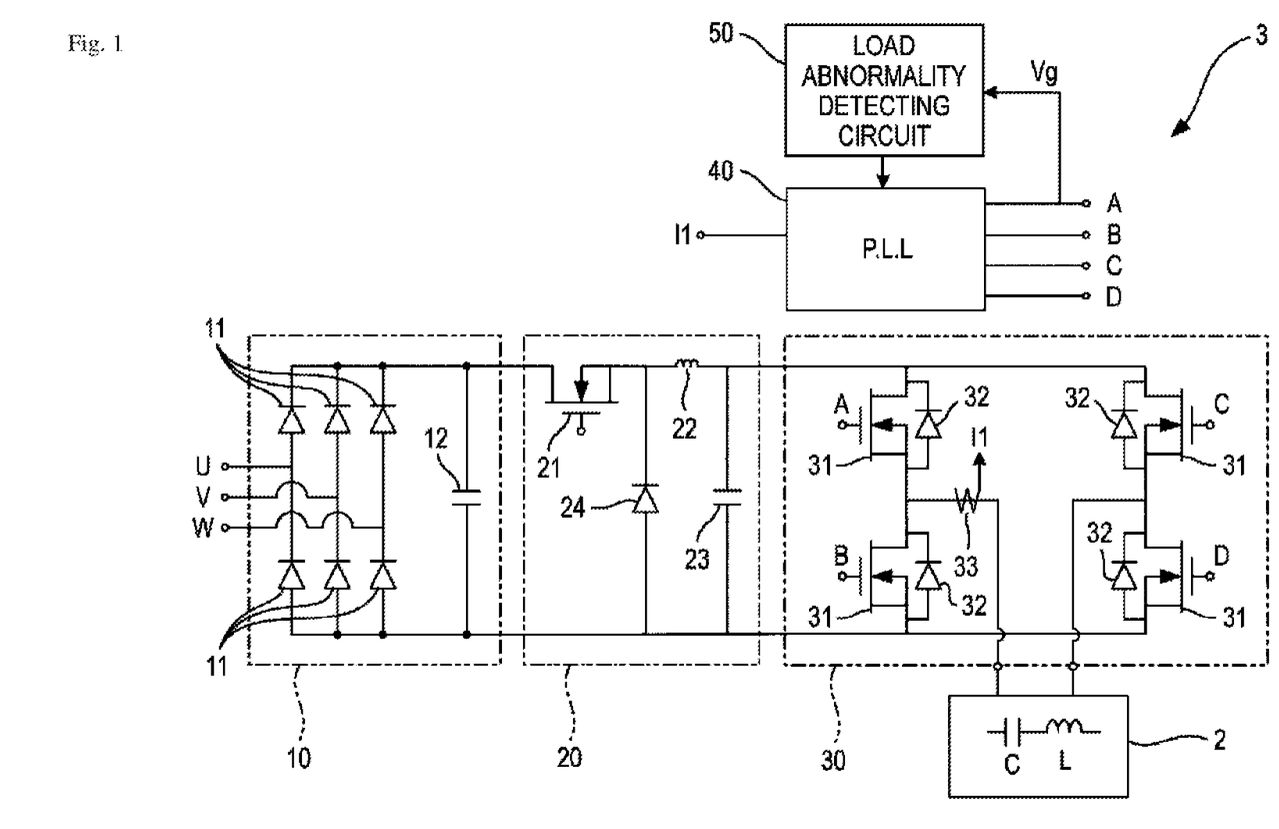
FIG. 1 is a circuit diagram illustrating an inverter apparatus according to a first embodiment.

Hereinafter, embodiments of the present invention are described based on the drawings. In the following description, the same reference numerals are used to designate the same elements and circuits previously described, and a description thereof is omitted or simplified. FIG. 1 illustrates an inverter apparatus 3 according to a first embodiment of the present invention. The inverter apparatus 3 is obtained by adding a load abnormality detecting circuit 50 to the aforementioned inverter apparatus 1. As the MOSFETs 31 of the inverter circuit 30, for example, a Si-MOSFET, a SiC-MOSFET and the like are used.

The load abnormality detecting circuit 50 uses a phase shift detection method for detecting a phase shift of a signal voltage Vg of a gate voltage signal applied to the MOSFETs 31 from the PLL circuit 40 and the output current I1 output from the inverter apparatus 3 to the load 2, and sends a first abnormal load signal based on the phase shift. The gate voltage signal obtained from the PLL circuit 40 and the current I1 obtained from the current transformer 33 connected to the PLL circuit 40 are configured to be input to the load abnormality detecting circuit 50.

Figure 2:
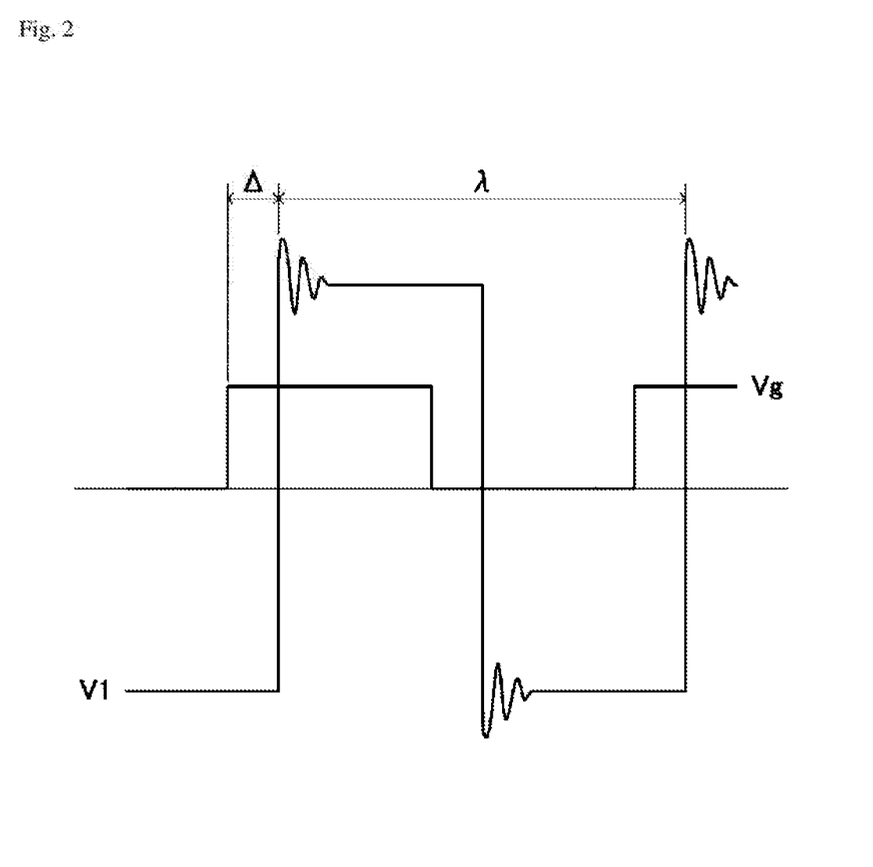
FIG. 2 is a graph illustrating a relation between a signal voltage Vg of a gate signal used in load abnormality detection of the first embodiment and an output voltage output from the inverter apparatus to a load.

As illustrated in FIG. 2, a cycle of the signal voltage Vg of the gate voltage signal and a cycle of the output voltage V1 output from the inverter apparatus 3 to the load 2 coincide with each other. The signal voltage Vg of the gate voltage signal includes no noise component superposed on the output voltage V1 due to ringing of the MOSFET 31. Consequently, the signal voltage Vg of the gate voltage signal can be preferably used as a voltage for detecting the phase shift with the output current I1, instead of the output voltage V1.

However, between both voltages Vg and V1, a phase shift may occur due to a response delay time Δ of the MOSFET 31 which is turned on/off based on the gate voltage signal. The response delay time Δ is defined as the sum of a turn-on delay time td and a rise time tr, wherein the turn-on delay time td is a time from rising 10% of a gate-source voltage VGS to rising 10% of a drain-source voltage VDS and the rise time tr is a time from the rising 10% to 90% of the drain-source voltage VDS. The response delay time Δ of the MOSFET 31 is preferably shorter than a half period λ/2 of the output voltage V1, and it is more preferably that it is sufficiently shorter than the half period λ/2 (for example, ¹⁄₁₀ or less of the half period λ/2). As described above, since the advance of the phase of the output current I1 with respect to the output voltage V1 causes a surge voltage, when the response delay time Δ of the MOSFET 31 is equal or more than the half period λ/2 of the output voltage V1, whether the phase shift of the output current I1 with respect to the output voltage V1 corresponds to an advanced phase or a delayed phase is difficult to be determined based on a detection result of the phase shift of the output current I1 and the signal voltage Vg.

The gate voltage signal input to the load abnormality detecting circuit 50 may be any one (for example, a gate voltage signal sent to the gate A or the gate B) of gate voltage signals sent to the gates A to D from the PLL circuit 40, or an average of a plurality of gate voltage signals sent to the gates (for example, the gate A and the gate D) of the plurality of MOSFETs 31 which are synchronously turned on/off.

Figure 3:
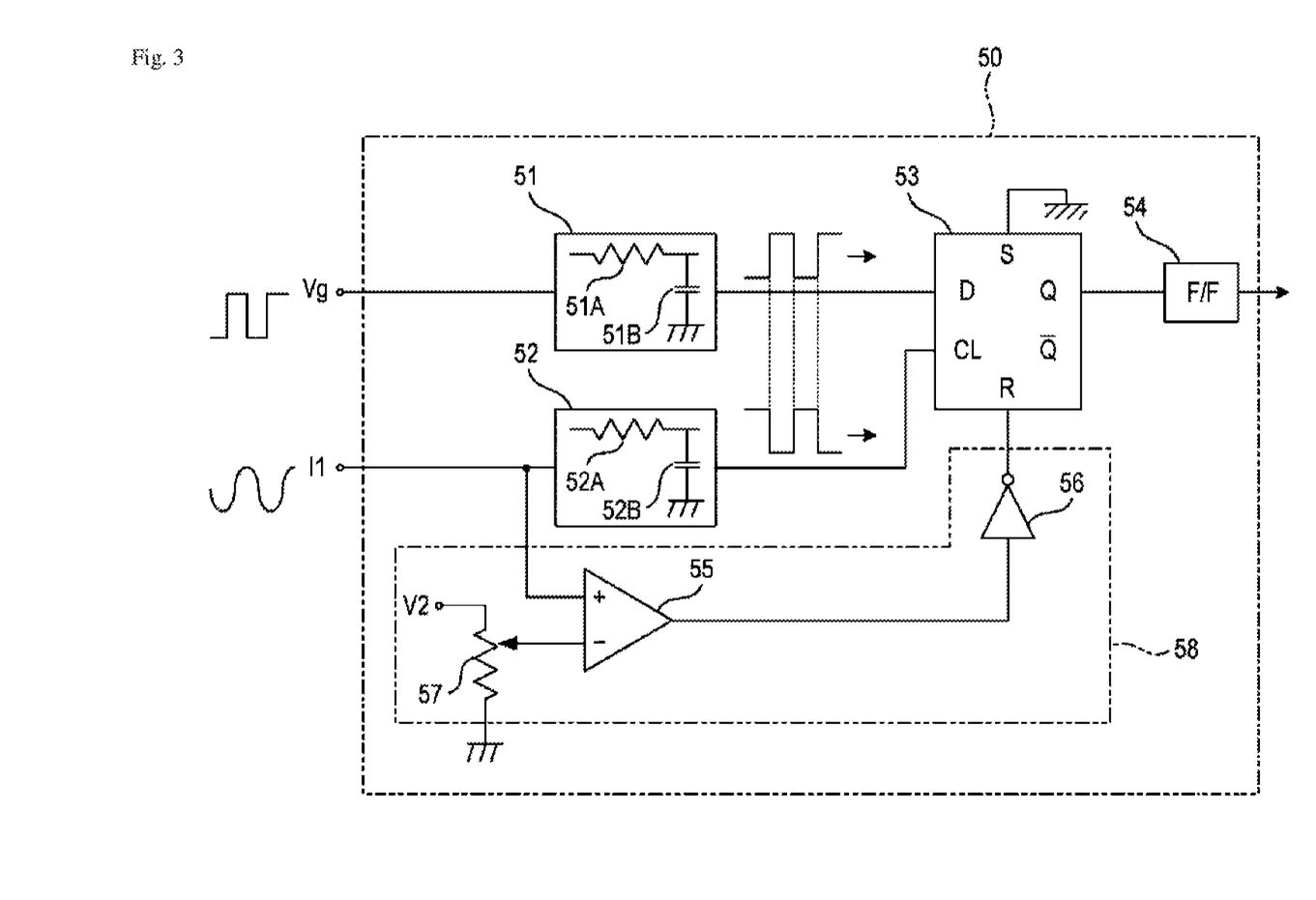
FIG. 3 is a circuit diagram illustrating a load abnormality detecting circuit according to the first embodiment.

As illustrated in FIG. 3, the load abnormality detecting circuit 50 is provided with a waveform shaper 51 for shaping a waveform of the voltage Vg to a predetermined square wave, a waveform shaper 52 for shaping a waveform of the current I1 to a predetermined square wave, a data flip-flop 53 serving as a phase shift detection means for detecting the phase shift of the voltage Vg and the current I1, a flip-flop 54 serving as a latch for holding output of the data flip-flop 53, a comparator 55 for detecting whether the size of the current I1 reaches a reference value, and an inverter 56 for inverting an output signal of the comparator 55.

The waveform shaper 51 includes a resistor 51A having a DC resistance value corresponding to an input voltage to the data flip-flop 53, a capacitor 51B for cutting an unnecessary harmonic component included in the waveform of the voltage Vg, and the like. Similarly to the waveform shaper 51, the waveform shaper 52 includes a resistor 52A having a DC resistance value corresponding to the input voltage to the data flip-flop 53, a capacitor 52B for cutting an unnecessary harmonic component included in the waveform of the current I1, and the like.

The current I1 is subjected to phase inversion of 180° from the original waveform and then is input to the data flip-flop 53. In other words, when the original waveform of the current I1 has the same phase as that of the voltage Vg, the signal of the current I1 input to the data flip-flop 53 has a phase opposite to that of the voltage Vg.

The data flip-flop 53 has a clock input port CL to which a clock signal is input, a data input port D to which a data signal is input, a set input port S to which a set signal is input, a reset input port R to which a reset signal is input, and a set signal port Q for sending the set signal when a set state is reached, wherein when the data signal is input simultaneously to the clock signal, since the set state is reached, the set signal is set from the set signal port Q.

The comparator 55 compares sizes of AC signals respectively input to two input ports thereof with each other. An AC signal indicating the value of the current I1 to the load 2 is input to one input port of the comparator 55. An AC signal obtained by dividing a predetermined AC voltage V2 by a variable resistor 57 is input to the other input port of the comparator 55 as a predetermined reference value. In this case, when the current I1 is larger than the reference value, a steady operation signal is output from the comparator 55. The steady operation signal is inverted by the inverter 56 and is sent to the reset input port of the data flip-flop 53. By the comparator 55, the inverter 56, and the variable resistor 57, a mask means 58 is formed to continuously output a reset signal to the data flip-flop 53 until the value of the current I1 is larger than the reference value.

In the present embodiment as described above, after the inverter apparatus 3 starts to operate, until the operation of the inverter apparatus 3 reaches a steady state, specifically, until the operating frequency of the inverter apparatus 3 coincides with the resonance frequency of the load 2 and the current I1 to the load 2 is larger than the reference value, the mask means 58 continuously outputs the reset signal to the data flip-flop 53 and the phase shift detection operation of the load abnormality detecting circuit 50 is stopped. In this way, the problem, which indicates that the inverter apparatus 3 is forcedly stopped immediately after the start-up of the inverter apparatus 3 in which the current I1 to the load 2 is unstable and the phases of the current I1 and the voltage Vg do not coincide with each other, is solved.

Then, when the operation of the inverter apparatus 3 reaches the steady state, the phase shift detection operation of the load abnormality detecting circuit 50 is started.

When there is no abnormality in the load 2, the resonance frequency of the load 2 coincides with the operating frequency of the inverter apparatus 3, and the phases of the voltage Vg and the current I1 coincide with each other, phases of signals respectively input to the clock input port CL and the data input port D of the data flip-flop 53 are inverted to each other. Therefore, since the data flip-flop 53 is still in the reset state and is not shifted to the set state and the set signal is not sent from the set signal port Q, the inverter apparatus 3 continuously operates.

On the other hand, when abnormality occurs in the load 2, the resonance frequency of the load 2 is shifted from the operating frequency of the inverter apparatus 3, the phases of the voltage Vg and the current I1 do not coincide with each other. In such a state, parts simultaneously serving as a positive electrode starts to occur in the signals respectively input to the clock input port CL and the data input port D of the data flip-flop 53. Therefore, the data flip-flop 53 is shifted to the set state and the set signal is sent from the set signal port Q. The set signal is input to the PLL circuit 40 of the inverter apparatus 3 via the flip-flop 54 as the first abnormal load signal.

The PLL circuit 40 receiving the first abnormal load signal appropriately turns off the MOSFETs 31 and stops the supply of power to the load 2, thereby protecting breakage of the MOSFETs 31. The first abnormal load signal is continuously output until the flip-flop 54 is reset.

According to the aforementioned present embodiment, there are the following effects.

That is, since the load abnormality detecting circuit 50 is provided to detect abnormality of the load 2 from the phase shift of the current I1 to the load 2 and the signal voltage Vg of the gate voltage signal, when the impedance of the load 2 is changed due to an accident and the like, the abnormality of the load 2 can be quickly detected from the phase shift of the current I1 and the voltage Vg occurring by variations of the resonance frequency of the load 2, and it is possible to reliably detect the abnormality of the load 2 before the PLL circuit 40 completes an operation of running at the resonance frequency of the load 2.

When the load abnormality detecting circuit 50 detects the load abnormality, the load abnormality detecting circuit 50 appropriately turns off the MOSFETs 31 of the inverter apparatus 3 and stops the supply of power to the load 2, so that it is possible to prevent the breakage of the MOSFETs 31 due to the abnormality of the load.

Moreover, the signal voltage Vg of the gate voltage signal, which does not include a noise component causing ringing of the MOSFETs 31, is used as a voltage for detecting the phase shift with the current I1, instead of the voltage V1 to the load 2 on which the noise component due to the ringing of the MOSFETs 31 is superposed, so that it is possible to prevent an erroneous operation of the load abnormality detecting circuit 50 due to an increase in the noise component and to accurately detect the abnormality of the load 2.

Furthermore, the load abnormality detecting circuit 50 is configured using the data flip-flop 53 that enters the set state by the data signal simultaneously input with the clock signal and sends set output which is a signal in the set state, a reverse phase signal of the current I1 flowing through the load 2 is allowed to be input to the clock input port CL, and the signal voltage Vg of the gate voltage signal is allowed to be input to the data input port D, so that the set signal is output from the data flip-flop 53 only when the phases of the current I1 and the voltage Vg are shifted from each other. In this way, the phase shift of the current I1 to the load 2 and the signal voltage Vg of the gate voltage signal can be detected using a simple circuit configuration and the load abnormality detecting circuit 50 can be considerably simplified.

Moreover, the load abnormality detecting circuit 50 is provided with the mask means 58 that compares the current value of the current I1 applied to the load 2 with a predetermined reference value and continuously outputs the reset signal to the data flip-flop 53 until the value of the current I1 is larger than the reference value, so that it is possible to prevent the occurrence of the problem that the phase shift detection operation of the load abnormality detecting circuit 50 is temporarily stopped at the start-up of the inverter in which the current I1 to the load 2 is unstable and the phases of the current I1 and the voltage Vg do not coincide with each other, and the inverter apparatus 3 is forcedly stopped immediately after the startup.

Figure 4:
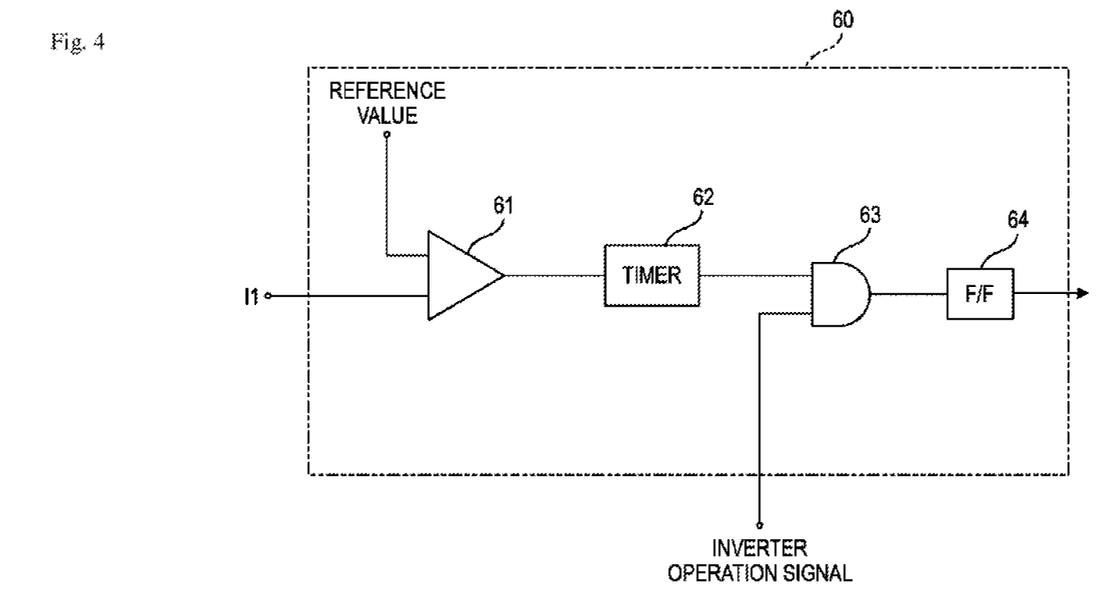
FIG. 4 is a circuit diagram illustrating a load abnormality detecting circuit according to a second embodiment of the present invention.

FIG. 4 illustrates a main part of a second embodiment of the present invention. In the present embodiment, a current reduction detection means 60 is added to the load abnormality detecting circuit 50 using the phase shift detection method in the aforementioned first embodiment. In the following description, since parts, other than the current reduction detection means 60, are similar to those of the first embodiment, only the current reduction detection means 60 is described.

The current reduction detection means 60 sends a second abnormal load signal based on the value of the current I1 flowing through the load 2, and includes a comparator 61 that compares the value of the current I1 applied to the load 2 with a predetermined reference value and sends the second abnormal load signal when the value of the current I1 is smaller than the reference value, as illustrated in FIG. 4.

The current reduction detection means 60 is provided with a timer 62 serving as a timing means that receives the second abnormal load signal from the comparator 61 and outputs the second abnormal load signal only when the second abnormal load signal is continued for a predetermined time or more, an AND circuit 63 serving as a mask means that receives the operation signal of the inverter apparatus 3 and outputs the second abnormal load signal only when the operation signal is input, and a flip-flop 64 serving as a latch for holding output of the AND circuit 63.

In the present embodiment, since the resonance frequency of the load 2 coincides with the operating frequency of the inverter apparatus 3, when the impedance of the load 2 is changed due to an accident and the like and its resonance frequency is varied from a state in which a current flowing through the load 2 is maximum, the resonance frequency is shifted from the operating frequency even though there is no change in an output voltage of the inverter apparatus 3 side, so that the current I1 flowing through the load 2 is reduced. When the comparator 61 detects the reduction of the current to the load 2, it is possible to reliably detect the abnormality of the load 2 before the PLL circuit 40 completes an operation of running at the resonance frequency of the load 2. When the load abnormality is detected, if the entire circuit is configured to stop the operation of the inverter, that is, to appropriately turn off the switching element so as to stop the supply of power to the load, the breakage of the switching element due to the abnormality of the load is more reliably prevented in advance.

Furthermore, even though the current I1 is instantaneously reduced by noise and the like, the current I1 to the load 2 is regarded not to be reduced by the timer 62, so that the inverter apparatus 3 stably operates.

Moreover, at the start-up of the inverter apparatus 3 in which the current I1 to the load 2 does not reach a rated value, the second abnormal load signal from the comparator 61 is temporarily blocked by the AND circuit 63, thereby solving a problem that the inverter apparatus 3 is forcedly stopped immediately after the start-up.

So far, the present invention has been described using preferred embodiments; however, the present invention is not limited to the embodiments and various improvements and design changes can be made in the range of not departing from the scope of the present invention.

For example, the rectification method of the rectifier circuit is not limited to the passive method in which a diode is employed as a rectification element; an active rectification element such as a SCR may be employed and an active method for phase-controlling the active rectification element may be employed.

Furthermore, the chopper method of the constant voltage circuit is not limited to the method employing the MOSFET; a switching element such as another bipolar transistor may be employed and when a diode rectifier circuit and a pulse width modulation type inverter circuit are combined with each other, the chopper type constant voltage circuit may be omitted.

Furthermore, the inverter circuit is not limited to the circuit employing the MOSFET; a switching element such as another bipolar transistor may be employed and in brief, the electrical elements, the electronic elements, and the circuit configurations of the body side of the inverter apparatus in the present invention can be appropriately selected when it is embodied.

In addition, the mask means of the aforementioned first embodiment and the mask means of the second embodiment can be replaced with each other, and the timing means of the second embodiment may also be added to the aforementioned first embodiment.

This application is based on Japanese Patent Application No. 2017-212183 filed on Nov. 1, 2017, the entire content of which is incorporated herein by reference.

The invention claimed is:

1. A load abnormality detecting circuit for an inverter to detect abnormality of a load during an operation of the inverter which has a self-arc-extinguishing element as a switching element and a phase synchronizing loop controlling an output frequency to be a resonance frequency of the load, the load abnormality detecting circuit comprising:
   a phase shift detection part that detects a phase shift between a gate voltage signal, which is applied to the self-arc-extinguishing and controls ON/OFF of the self-arc-extinguishing element, and an output current of the inverter, which is applied to the load, and that sends a first abnormal load signal based on the phase shift,
   wherein a response delay time of the self-arc-extinguishing element with respect to the gate voltage signal is shorter than a half period of the output frequency of the inverter.

2. The load abnormality detecting circuit for the inverter according to claim 1, wherein
   the phase shift detection part is a data flip-flop which is transitioned to a set state by a data signal input in synchronization with a clock signal, and sends a set output as a signal in the set state.

3. The load abnormality detecting circuit for the inverter according to claim 2, wherein
   the data flip-flop has a reset input port to which a reset signal to transition the data flip-flop from the set state to a reset state is input, and
   the load abnormality detecting circuit has a mask part that compares a current value of the output current applied to the load with a predetermined reference value and outputs the reset signal to the data flip-flop until the current value is larger than the reference value.

4. The load abnormality detecting circuit for the inverter according to claim 1, further comprising:
   a current reduction detection part that compares the current value of the output current of the inverter, which is applied to the load, with the predetermined reference value, and sends a second abnormal load signal when the current value is smaller than the reference value.

5. The load abnormality detecting circuit for the inverter according to claim 4, further comprising:
   a timing part to which the second abnormal load signal is input from the current reduction detection part and which outputs the second abnormal load signal only when the second abnormal load signal is continuously input for a predetermined time or more.

6. The load abnormality detecting circuit for the inverter according to claim 5, further comprising:
   a mask part to which an operation signal of the inverter is input and which outputs the second abnormal load signal only when the operation signal is input.

7. The load abnormality detecting circuit for the inverter according to claim 2, further comprising:
   a current reduction detection part that compares the current value of the output current of the inverter, which is applied to the load, with the predetermined reference value, and sends a second abnormal load signal when the current value is smaller than the reference value.

8. The load abnormality detecting circuit for the inverter according to claim 3, further comprising:
   a current reduction detection part that compares the current value of the output current of the inverter which is applied to the load, with the predetermined reference value, and sends a second abnormal load signal when the current value is smaller than the reference value.

9. The load abnormality detecting circuit for the inverter according to claim 1, further comprising a waveform shaper that shapes a waveform of the gate voltage signal which is input to the phase shift detection part; and
   a waveform shaper that shapes a waveform of the output current which is input to the phase shift detection part.

* * * * *